US009832874B2

United States Patent
Doering et al.

(10) Patent No.: US 9,832,874 B2
(45) Date of Patent: Nov. 28, 2017

(54) METHOD OF FORMING A PRINTED CIRCUIT BOARD ASSEMBLY

(71) Applicant: INTERNATIONAL BUSINESS MACHINES CORPORATION, Armonk, NY (US)

(72) Inventors: Andreas C. Doering, Rueschlikon (CH); Ralph Heller, Rueschlikon (CH); Ronald P. Luijten, Rueschlikon (CH); Martin L. Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 14/745,526

(22) Filed: Jun. 22, 2015

(65) Prior Publication Data

US 2015/0351256 A1    Dec. 3, 2015

Related U.S. Application Data

(63) Continuation of application No. 14/715,943, filed on May 19, 2015, now Pat. No. 9,414,493.

(30) Foreign Application Priority Data

May 28, 2014  (GB) .................................. 1409416.3

(51) Int. Cl.
*H05K 3/20* (2006.01)
*H05K 1/11* (2006.01)
(Continued)

(52) U.S. Cl.
CPC ............ *H05K 1/117* (2013.01); *H01R 12/52* (2013.01); *H01R 12/73* (2013.01);
(Continued)

(58) Field of Classification Search
CPC .. H05K 1/117; H05K 1/144; H05K 2201/042; H05K 2201/10159;
(Continued)

(56) References Cited

U.S. PATENT DOCUMENTS 4,416,497 A * 11/1983 Brandsness .......... H01R 12/774
                                                                439/492
7,811,135 B2 * 10/2010 Idzik ........................ H01R 4/02
                                                                439/629
(Continued)

OTHER PUBLICATIONS

Appendix P, List of IBM Patents or Patent Applications Treated as Related dated Jun. 9, 2016.

*Primary Examiner* — Donghai D Nguyen
(74) *Attorney, Agent, or Firm* — Jay Wahlquist (57) ABSTRACT

A printed circuit board (PCB) assembly includes a first PCB and a second PCB disposed substantially parallel and opposite to each other, such that a second side of the first PCB is opposite to a first side of the second PCB; wherein the second PCB has a first set of side connectors on its first side and a second set of side connectors on its second side, configured for both electrical power supply to and signal communication with the second PCB; the second PCB both electrically and mechanically connected to the second side of the first PCB via a first elastomeric connector; and the second PCB electrically connected to the first PCB via its second set of side connectors and a flexible electrical connector that is electrically connected to the second set of side connectors and the first PCB.

15 Claims, 4 Drawing Sheets

(51) Int. Cl.
   *H01R 12/73* (2011.01)
   *H05K 1/14* (2006.01)
   *H01R 43/26* (2006.01)
   *H01R 12/52* (2011.01)
   *H01R 13/24* (2006.01)
   *H05K 3/36* (2006.01)

(52) U.S. Cl.
   CPC ......... *H01R 13/2414* (2013.01); *H01R 43/26* (2013.01); *H05K 1/144* (2013.01); *H05K 3/368* (2013.01); *H05K 2201/0133* (2013.01); *H05K 2201/0314* (2013.01); *H05K 2201/041* (2013.01); *H05K 2201/042* (2013.01); *H05K 2201/10159* (2013.01); *H05K 2201/10189* (2013.01); *H05K 2201/10265* (2013.01); *H05K 2201/10954* (2013.01); *Y10T 29/49128* (2015.01)

(58) Field of Classification Search
   CPC . H05K 2201/10265; H05K 2201/0133; H05K 2201/0314; H05K 2201/10189; H05K 2201/041; H05K 2201/10954; H05K 3/368; Y10T 29/49128; Y10T 29/49133; Y10T 29/49147; H01R 13/2414; H01R 12/73; H01R 12/774; H01R 4/02; H01R 43/26
   USPC ............ 29/831, 833, 842; 439/67, 492, 629; 361/760
   See application file for complete search history.

(56) References Cited

U.S. PATENT DOCUMENTS 8,432,705 B2 * 4/2013 Ge .......................... G06F 1/185
                                                                361/760
2015/0351242 A1 12/2015 Doering

* cited by examiner

METHOD OF FORMING A PRINTED CIRCUIT BOARD ASSEMBLY

DOMESTIC AND FOREIGN PRIORITY

This application is a continuation of U.S. patent application Ser. No. 14/715,943, filed May 19, 2015, now U.S. Pat. No. 9,414,493, which claims priority to Great Britain Patent Application No. 1409416.3, filed May 28, 2014, and all the benefits accruing therefrom under 35 U.S.C. §119, the contents of which in its entirety are herein incorporated by reference.

BACKGROUND

The invention relates in general to the field assemblies of printed circuit boards (or PCBs). In particular, it is directed to assemblies of storage module PCB and mSATA or SATA M.2 PCBs.

A microserver is a server class computer which is based on a system on a chip (SoC). An example of microserver is discussed in Doering, A. C.; Kiss, T., "Monitoring and Controlling System for Microservers," Parallel and Distributed Processing Symposium Workshops & PhD Forum (IPDPSW), 2013 IEEE 27th International, pp. 1538-1541, May 2013, http://ieeexplore.ieee.org/stamp/stamp.jsp?tp=&arnumber=6651048&isnumber=6650854.

Microservers may use various types of modules, for example: compute modules (e.g., using a DIMM-240 connector); power converter modules (using an extreme PowerEdge connector) and switch modules (using an Impact 100 series connector, Molex). While the main purpose of the compute modules is to contain processors and main memory, one may contemplate using them together with storage devices, for instance based on Flash technology. However, doing so poses several problems of connections and, in turn, of encumbrance. This can become a serious issue in space-constraint arrangements as needed in microservers.

SUMMARY

In one embodiment, a printed circuit board (PCB) assembly includes a first PCB and a second PCB disposed substantially parallel and opposite to each other and each having a first side and a second side opposite to each other, such that the second side of the first PCB is opposite to the first side of the second PCB; wherein the second PCB has a first set of side connectors on its first side and a second set of side connectors on its second side, the first and second sets of connectors configured for both electrical power supply to and signal communication with the second PCB; the second PCB both electrically and mechanically connected to the second side of the first PCB via a first elastomeric connector arranged between the first side of the second PCB, where it connects to the first set of connectors, and the second side of the first PCB; and the second PCB electrically connected to the first PCB via its second set of side connectors and a flexible electrical connector that is electrically connected to the second set of side connectors and the first PCB.

DETAILED DESCRIPTION

According to a first aspect, an assembly of printed circuit boards or PCBs, includes a first PCB and a second PCB maintained essentially parallel and opposite to each other and having, each, a first side and a second side opposite to each other, such that the second side of the first PCB is opposite to the first side of the second PCB, wherein the second PCB: has a first set of side connectors on its first side and a second set of side connectors on its second side, the first and second sets of connectors configured for both electrical power supply to and signal communication to and/or from the second PCB; is both electrically and mechanically connected to the second side of the first PCB via a first elastomeric connector arranged between: the first side of the second PCB, where it connects to the first set of connectors, and the second side of the first PCB; and is electrically connected to the first PCB via: its second set of side connectors and a flexible electrical connector that is electrically connected to the second set of side connectors and the first PCB.

In embodiments, the second PCB is electrically connected to the first PCB via: a second elastomeric connector, which connects to the second set of side connectors of the second PCB; and the electrical connector, which connects both: the second elastomeric connector; and the first PCB.

The second PCB is electrically connected to the first side of the first PCB via: its second set of side connectors and the flexible electrical connector, the latter connected to the first side of the first PCB.

The electrical connector has a portion extending over a lateral edge of the first PCB and a lateral edge of the second PCB, perpendicularly to the average planes of the first and second PCBs. The electrical connector is a flat flex cable.

In embodiments, the electrical connector is a rigid-flex connector, which is integral with the first PCB.

The above assembly further includes a fastening structure maintaining the flex connector, the first elastomeric connector, the second elastomeric connector, as well as a lateral edge of each of the first PCB and the second PCB.

The fastening structure has a U-section and is arranged such as to clamp the flex connector, the first elastomeric connector, the second elastomeric connector, and the lateral edge of each of the first PCB and the second PCB.

The assembly includes a set of at least two, preferably four and more preferably eight second PCBs, each configured with respect to the first PCBs similarly as the second PCB, whereby each of the second PCBs is maintained essentially parallel and opposite to the first PCB, and wherein, the second PCBs are arranged side by side on one side of the first PCB or in one or more pairs, with each second PCBs of one pair on each side of the first PCB.

In embodiments, one or more of the second PCBs of the set are arranged on the second side of the first PCB, and one or more other second PCBs of the set are arranged on the first side of the first PCB.

The assembly includes a set of four second PCBs, each arranged on the second side of the first PCB, and wherein, preferably, the assembly comprises a set of eight second PCBs, wherein four second PCBs of the set are arranged on the first side of the first PCB and four second PCBs of the set are arranged on the second side of the first PCB.

In embodiments, the first PCB includes a storage module PCB and any second PCB comprises an mSATA PCB.

The above assembly further comprises an essentially flat flash memory component on one side of a second PCB, which flash memory component has an average thickness that substantially corresponds to the thickness of the first elastomeric connector, and wherein, preferably, the assembly further comprises two flash memory components on each side of the second PCB, and wherein, more preferably, one or each flash memory component is a NAND flash memory.

In embodiments, this assembly further includes a power converter and a module controller, each arranged in electrical contact with, preferably on one side of, the first PCB, wherein the module controller is electrically connected to one or more second PCB and is otherwise configured to enable the power converter.

The first elastomeric connector, and other elastomeric connectors of the assembly, are each electrically conducting along directions perpendicular to its average plane and are not electrically conducting in-plane, and each include deformable layers of alternating conductive and insulating materials.

Devices embodying the present invention and fabrication methods thereof will now be described, by way of non-limiting examples, and in reference to the accompanying drawings. Technical features depicted in the drawings are not necessarily to scale.

Embodiments of the invention are first generally described in reference to FIGS. 1-4. Embodiments described herein provide an assembly 10 of printed circuit boards (hereafter PCBs, for short), wherein the assembly includes two types of PCBs: a first PCB 21 and a second PCB 22, which are maintained essentially parallel and opposite to each other (they are essentially flat components, as known). Each of the PCBs has a first (main) side and a second (main) side, which are opposite to each other. For instance, and as depicted in the appended drawings, the first PCB 21 has a first side 211 opposite to its second side 212. Similarly, the second PCB 22 has opposite first and second sides 221 and 222, such that the second side 212 of the first PCB 21 is opposite to the first side 221 of the second PCB 22. Note that, in FIG. 1, the "first side" of any PCB (21 or 22) is always on the left and the second side is always on the right.

The second PCB 22 has a first set C1 of side connectors on its first side 221 and a second set C2 of side connectors on its second side 222. The first and second sets of connectors are known per se. They can be used for both electrical power supply and signal communication. In particular, they are configured for enabling electrical power supply to the second PCB and signal communication to and/or from the second PCB.

Furthermore, the second PCB 22 is both electrically and mechanically connected to the second side 212 of the first PCB 21 via a first elastomeric connector 31. The latter is arranged between: the first side 221 of the second PCB, where it connects to the first set C1 of connectors; and the second side 212 of the first PCB, e.g., via contact tracks 45.

Finally, the second PCB 22 is electrically connected to the first PCB 21 via: its second set C2 of side connectors and a flexible electrical connector 40. The flexible electrical connector 40 is electrically connected to each of: the second set C2 of side connectors; and the first PCB.

As further discussed in more detail later, the first PCB typically is a storage module PCB (e.g., 1.27 mm thick, for DIMM socket), whereas the second PCB may for example be an mSATA or a SATA M.2 PCB, i.e., a two-sided or double-sided connected PCB, which may include flash memories 61, 62 on each of its first and second sides. The first and second PCBs extend generally in parallel planes. As known in the art, mSATA stands for mini-SATA, i.e., a standard used by small devices such as 1.8" SATA drives and mini SSDs. SATA or Serial ATA stands for Serial Advanced Technology Attachment.

The side connectors C1, C2 of the second PCB 22 are edge connectors. As known, an edge connector is a part of a PCB that can be plugged into a computerized device. It generally involves a row of broad metallic tracks that provide electrical connection. The invention nevertheless extends, in principle, to PCBs having any type of connectors (for signal communication and/or power supply) on opposite sides.

The flexible electrical connector 40 is typically what is usually called a flex connector, e.g., a flex flat cable. The connector 40 may connect to the first PCB 21, e.g., on its first side, via a solder joint 80. The versatility of a flexible electrical connector allows for minimization of the space needed for connecting the second set C2 of connectors to the first PCB. Indeed, the conventionally available connectors, e.g. Molex 48338-0090 or MMT MiniPCIE600, are too large, in height and depth, for achieving compact arrangements. On the contrary, the PCB assemblies proposed herein allow for instance to fit four mSATA drives on one side of a microserver compute module of 138×55 mm (including DIMM contacts), which would not be possible when using conventional connectors.

The flexible electrical connector 40 is preferably a separate component, i.e., not integral with either the first or the second PCB. It is both electrically and mechanically connected to each of the first PCB and the second PCB, via the second side 222 of the second PCB 22.

Figure 1:
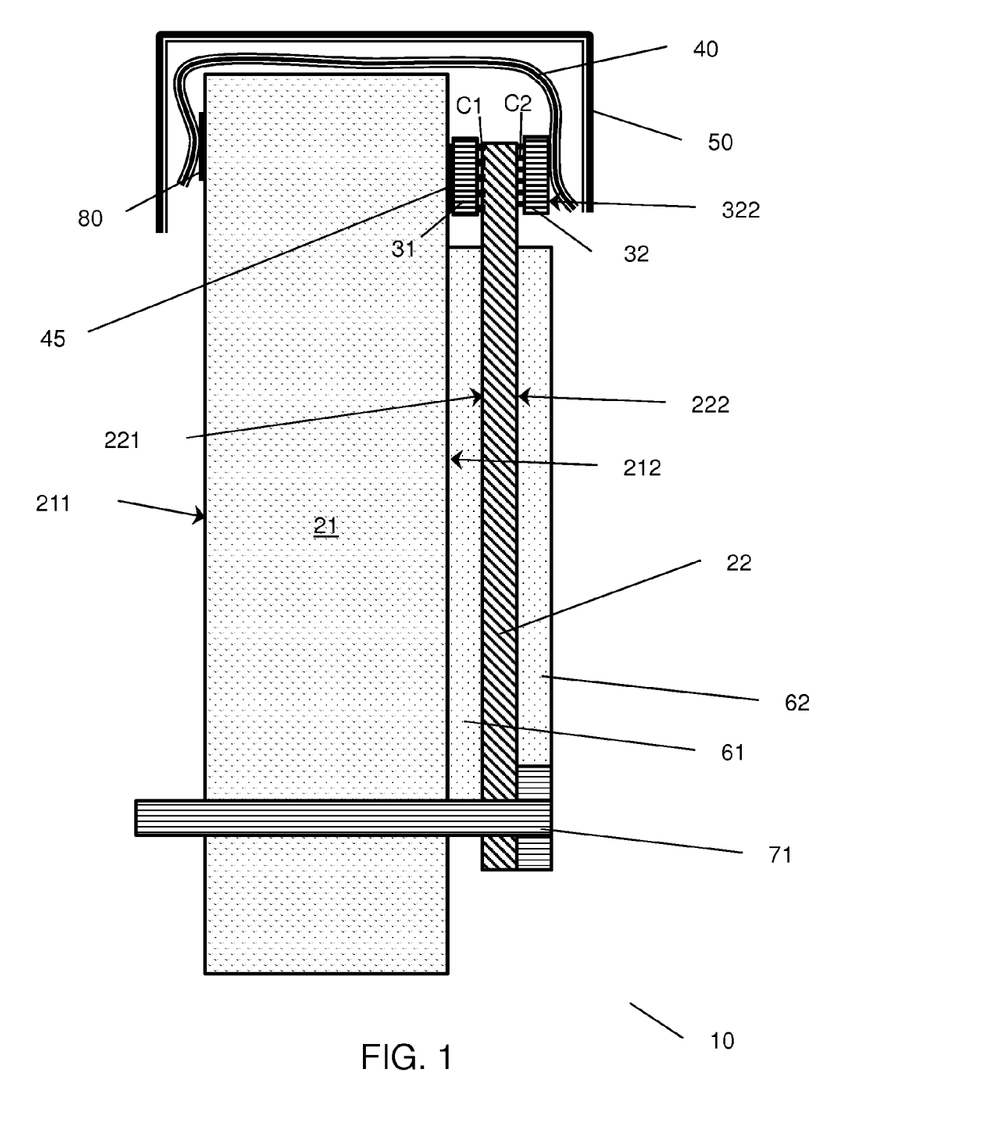
FIG. 1 is a 2D cross-sectional view of a simplified representation of a one-sided assembly, i.e., comprising one or more second PCBs arranged on one side of a first PCB, according to embodiments.
Figure 2:
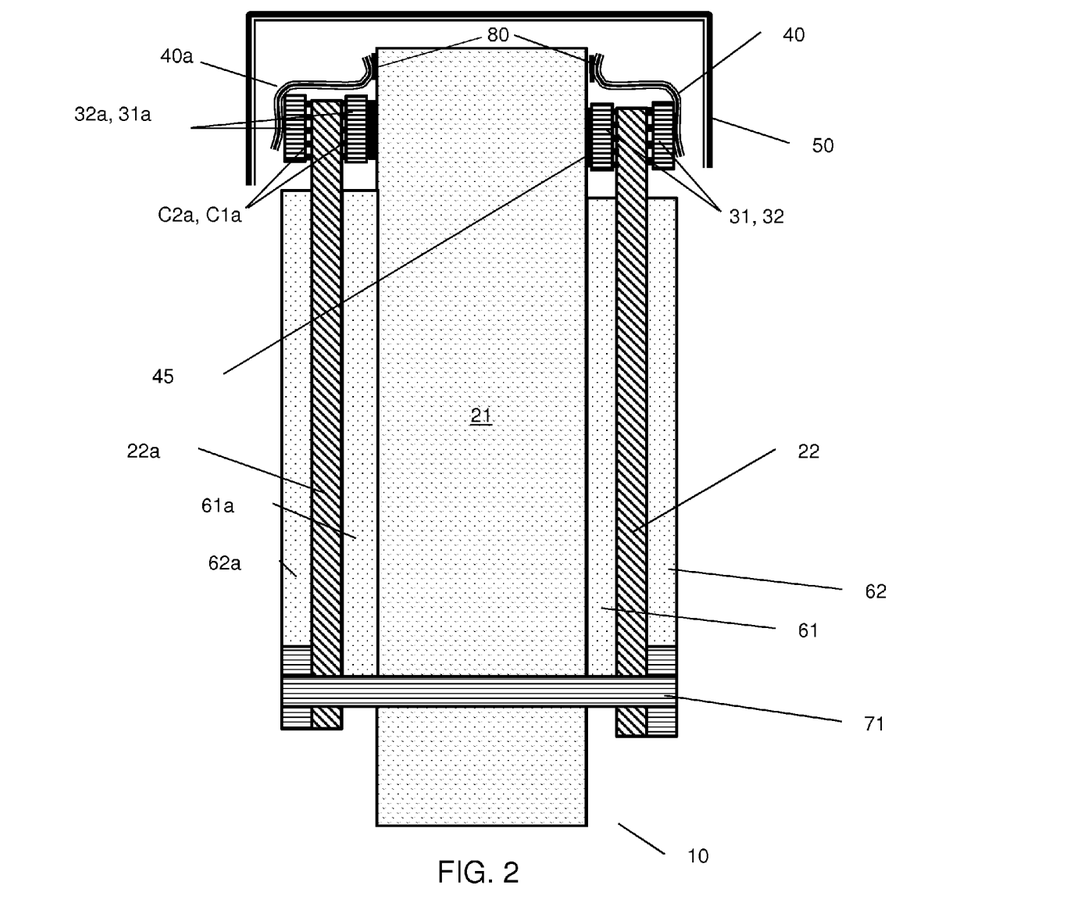
FIG. 2 is a 2D cross-sectional view of a simplified representation of a two-sided assembly, i.e., comprising one or more second PCBs arranged on each side of the first PCB, according to embodiments.
Figure 3:
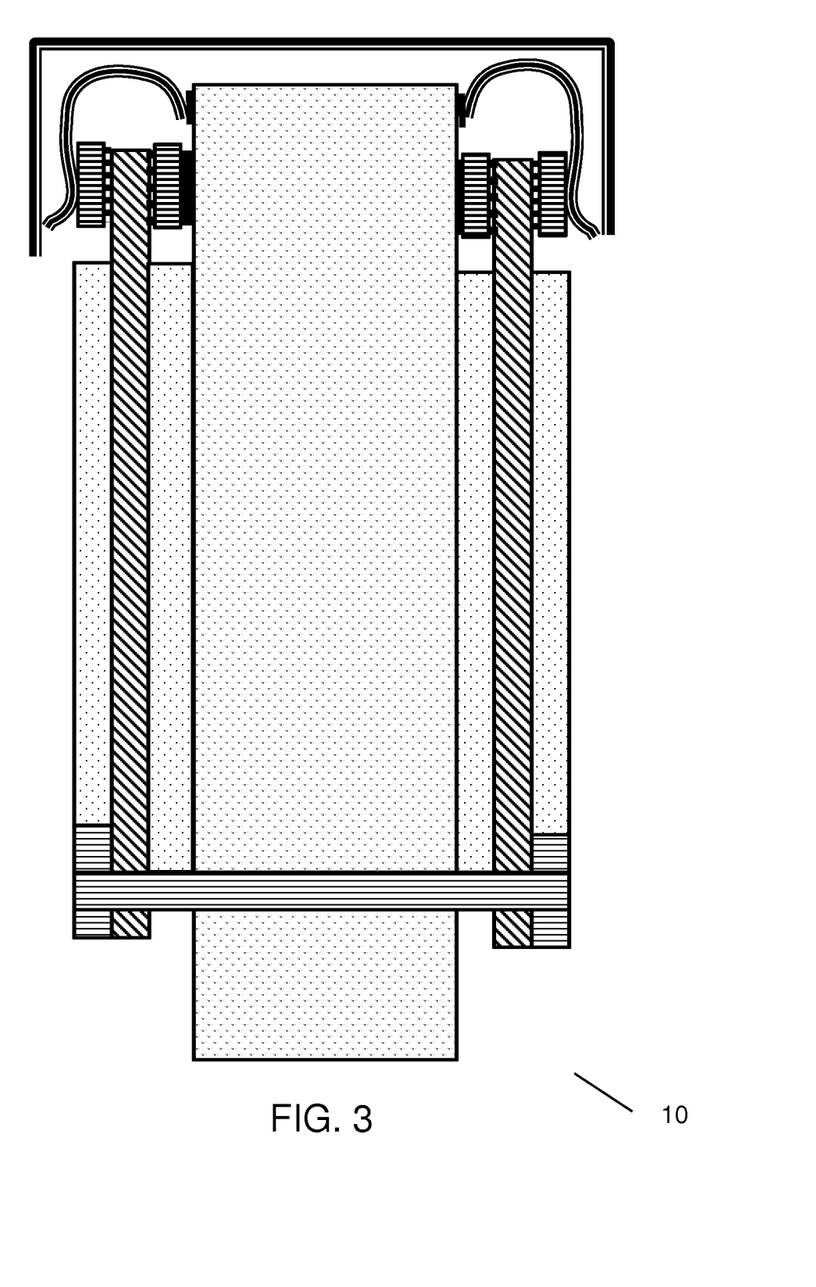
FIG. 3 illustrates a variant to FIG. 2, where a flexible electrical connector used to connect the first and second PCBs is in a U-turn configuration, according to embodiments.
Figure 5:
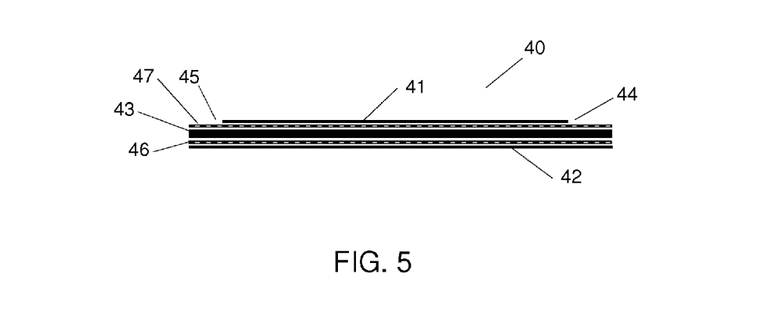
FIG. 5 is a cross-section view of a simplified representation of a flex connector, as involved in embodiments of the invention.

For instance, FIG. 5 shows a cross-section view of a simplified representation of an example of flex connector that can be used in embodiments of the present invention. This view shows a flex 40, comprising copper tracks (for conducting electrical current and thereby signal) 46, 47. The two copper tracks are separated by a thick inner material 43 (typically a polymer providing the mechanical properties of the flex 40 and ensuring electrical insulation between the tracks 46, 47), which typically has a controlled thickness. The external insulating material 41, 42 (typically a polymer too) has typically a minimal thickness. This material is open on selected areas (not insulated) to provide contact areas 44, 45. Note that flexes may be provided with non-insulating areas 44, 45 on a same side (e.g., when implemented in embodiments such as depicted in FIG. 1 and FIG. 2) or on opposite sides (e.g., when implemented in embodiments such as depicted in FIG. 3). In this respect, there are techniques that allow 'soldering' from both sides, either by having a second layer and vias on non-insulating area or by having an opening in the inner material 43. Finally, numerous variants to FIG. 5 can be contemplated. The example of FIG. 5 is particularly well suited for high-speed SATA using a double layer flex to work in an impedance controlled manner.

In variants, the flexible connector 40 may be a so-called rigid-flex, i.e., integral with the first PCB. In such cases, the flex is a continuation of the first PCB (it is part of, or integral therewith), and is mechanically and electrically connected to the other PCB. By electrical connection, it is meant a connection that allows for power supply and/or signal transmission. The flexible electrical connector can accordingly be used for electrical power and/or signal supply.

Finally, the use of an "elastomeric connector" 31 allows for transmitting signal/power perpendicularly to the metallic tracks or pins of the connectors C1. The term "elastomeric connector" is known in the art to refer to an element that is electrically conducting in some (e.g., perpendicularly to its average plane) but not all (e.g., in-plane) directions, which is appropriate in the present case because it allows for compactness and further eases the connection with the side connectors C1. The elastomeric connectors 31, 32 may for instance comprise slightly deformable layers (e.g., rubberized layers) of alternating conductive and insulating materials. Consistently, the term "elastomeric connector" is meant to describe any elastic material that resumes its original shape when a deforming force is removed, and which is electrically conducting along directions perpendicular to the average planes of the first and second PCBs, and which are not electrically conducting along directions parallel to the average planes of the PCBs. Preferably, such connectors are, each, made of deformable layers of alternating conductive and insulating materials. The elastomeric connectors used herein shall preferably have an aspect ratio (their thickness is less than their width, to optimize compactness), such as to be electrically conducting along directions perpendicular to their average planes (but not electrically conducting in-plane).

Elastomeric connectors are usually used in shock and anti-vibration applications. They can occasionally be used to create a gasket-like seal. Here, the elastomeric connector 31 is used to leverage its directional conductivity, which provides a shortest path to the first PCB 21, whereas the flexible connector 40 on the opposite side allows to optimally get around the edge of the PCB 22. Altogether, this allows for obtaining very compact arrangements, as illustrated in the embodiments shown in FIGS. 1-3.

Elastomeric connectors used in the present applications may preferably comprise deformable layers of alternating conductive and insulating materials. They are typically chosen to have a height or thickness matching substantially the height or thickness of the flat Flash memory components 61, 62 of the second PCB 22, to further improve the resulting compactness.

Using a flexible electrical connector 40, e.g., a flex connector or a flex flat cable, is in fact advantageous in many respects. It can be bent such that the resulting encumbrance will essentially be determined by the thickness of the stack of connectors 31-32, i.e. the sum of the thickness of the connectors 31 and 22, as illustrated in FIGS. 1-3. Different configurations of the flex 40 are possible (compare FIGS. 1, 2 and 3, a U-turn configuration may be preferred, to further improve compactness, see FIG. 3). When one desires to use different PCB (e.g., mSATA drives) 22, each connected to the first PCB 21, side by side or on opposite sides thereof, there can be tolerances in the height of the components which determine the distance between PCBs 21 and 22. The elastomeric connector 40 is elastic and deformable, so that its thickness can be somewhat adapted to conform to particular height constraints.

To summarize, the above arrangements allow for compact structures to be obtained, notably in terms of height (i.e., the horizontal direction in FIGS. 1-3). Ideally, only the thickness of the flexible electrical connector 40 is added to the heights of the PCBs and possibly the flash memories 61, 62. In practice, a little bit more than the flex thickness is added, due to its bending radius. Eventually, the obtained structures are more compact in each dimension.

The above arrangements advantageously apply to storage modules. Assume, for instance, that one wants to place, e.g., four or eight mSATA modules 22 (depending on the height profile of neighbor modules) on the carrier PCB 21. One problem that arises is the size of connectors between the mSATA modules and the carrier PCB. The conventionally available connectors are too large, in height and depth to meet the requirements, e.g., to fit four mSATA modules on one side of the compute module including DIMM contacts. This problem can be solved, thanks to the invention, by connecting the mSATA modules via the elastomeric connectors 31 on one side and flexible connectors 40 on the other side, which both contact the carrier PCB 21, as described above in reference to FIGS. 1-3.

Next, in embodiments such as illustrated in FIGS. 1-3, the second PCB 22 is electrically connected to the first PCB 21 via: a second elastomeric connector 32, which connects to the second set C2 of side connectors of the second PCB 22; and the electrical connector 40 (the latter connects both the second elastomeric connector 32 and the first PCB). Since elastomeric connectors advantageously provide a satisfactory contact pressure on the side connectors C1 and C2, an additional elastomeric connector 32 is preferably used on the side opposite to the side where the first elastomeric connector 31 is arranged. The second elastomeric connector 32 connects the second set C2 of connectors to the flexible connector 40, which ensures sufficient contact pressure for connecting both the second set C2 of connectors and the flex 40. This, in turn, allows to reliably connect the second PCB 22 to the first PCB 21. In other words, using a second elastomeric connector makes the contact between, on the one hand, the first PCB and the second PCB and, on the other hand, the flex 40 and the second PCB 22, more reliable.

The use of the second elastomeric connector 32 further eases the connection of the flexible connector 40, as the later does not need to be connected to the connector 32 by its very end. On the contrary, an end piece of the flex 40 is typically dangling, as illustrated in FIGS. 1-3.

The flex connector 40 is fully isolated but in contact areas 44, 45 (see FIG. 5), i.e., the contact areas to the elastomeric connector 32, 32a and to the first PCB 21. At the contact locations to the elastomeric connector, the non-isolated contact areas 44, 45 preferably match the form, size and arrangement of the contact areas on the second PCB 22. In order to ease the assembly, the contact areas on the flex connector can be made slightly narrower than the standard contact pads, for instance the mSATA standard.

Electrical contact is established by pressing the flex connector against the elastomeric connector. The reliability of such a connection will be substantially improved by way of mechanical pressure. Mechanical pressure can for instance be achieved by a fastening structure 50 as described later. There are, however, other ways to create that pressure or maintain the flex 40. For example, the whole assembled module could be casted in resin, it could be packed air-tight in strong foil and air sucked out (to create an underpressure within the foil), several similar modules can be packed close together so that the neighboring modules press against the assembly, or if the module is used in a pre-formed enclosure such as for a mobile phone or tablet computer the enclosure would provide the fixing pressure.

The flex 40 may be soldered directly to the PCB 21 on one side, e.g., via pads 80, and will contact the other PCB 22 via the elastomeric connector 32, 32*a*. Geometrically speaking, the electrical connector 40 connects a second side 322 of the second elastomeric connector 32 i.e., the right-most side in FIG. 1, where this second side 322 is opposite to a first side of the second elastomeric connector 32 i.e., the left-most side of connector 32 in FIG. 1 (not referenced for clarity). Since the second elastomeric connector 32 is on the second side 222 of the second PCB 22, the first side of the second elastomeric connector 32 typically faces the second side 222 of the second PCB 22.

Referring now more specifically to FIG. 1, the second PCB 22 may, in embodiments, be electrically connected to the first side 211 of the first PCB 21. This connection involves its second set C2 of side connectors and the flexible electrical connector 40. The second elastomeric connector 32 still connects the second set C2 of connectors to the flexible connector 40. Use is made of the flexibility of the flexible connector 40 to connect the first side 211 of the first PCB 21, as depicted in FIG. 1.

As further seen in FIG. 1, the electrical connector 40 may have a portion extending over the lateral edge of the first PCB 21 and the lateral edge of the second PCB 22, perpendicularly to the average planes of the first and second PCBs, such as to get around the first PCB and connect to its first side 211.

In variants, the flexible electrical connector 40 may simply connect to the second side 212 of the first PCB 21, as depicted in FIGS. 2 and 3, e.g., using again appropriate contact pads (80). In that case, the electrical connector 40 typically has a middle portion extending over lateral edges of the second PCB 22 and elastomeric connectors 31, 32.

Connecting the flex 40 to the first PCB 21 on its second side 212 eases the alignment; it is further beneficial in that no stress is applied to the flex on the left edge of the first PCB 21. Accordingly, the flex connector 40 may also connect to the second side 212 of the first PCB 21.

As described earlier, the electrical connector 40 is preferably a flat flex cable, which is known per se. In the present context, it allows for minimizing the overall encumbrance of the connections. In variants, the electrical connector may be a rigid-flex connector, which is integral with the first PCB 21. In that case, the rigid-flex connector is an extension of the first PCB 21 and solely needs to be connected to the second PCB 22 (no additional mechanical connection is needed between the rigid-flex and the first PCB 21).

Advantageously, the present assemblies may further comprise a fastening structure 50 (or any suitable binding structure), arranged such as to maintain the flex connector 40, the first and second elastomeric connectors 31, 32, as well as a lateral edge of each of the first PCB 21 and the second PCB 22. Such a fastening structure 50 provides mechanical pressure to maintain the needed electrical and mechanical connections between the various components above, in a particularly reliable manner.

As depicted in FIGS. 1-3, this fastening structure 50 has a U-section and is arranged such as to clamp the flex connector 40, the first and second elastomeric connectors 31, 32, and the lateral edge of each of the first PCB 21 and the second PCB 22. The fastening structure may be a holder, a fastener like a binder clip or a clamp, having typically a U-section. It allows for fastening and compressing the superimposed PCBs by compressing the deformable elastomeric connectors 31, 32, thereby reducing the height of the assembly and improving compactness. Such fastening structures further have minimal encumbrance.

Referring now to FIGS. 1-4 (and in particular to FIG. 4), in embodiments, the assembly shall typically comprise a set of several second PCBs, as made possible thanks to the compact arrangements proposed herein. The assembly may for instance comprise a set of four or eight second PCBs 22. Each of these second PCBs is arranged with respect to the first PCBs similarly as discussed above. Namely, each second PCB is maintained essentially parallel and opposite to the first PCB and connected to the first PCB by way of elastomeric connectors and flexible connectors.

Figure 4:
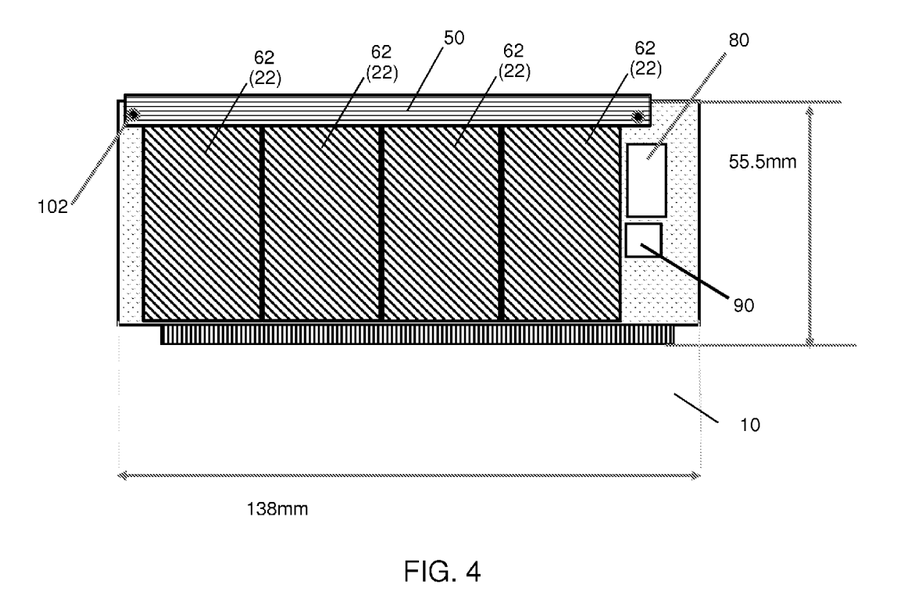
FIG. 4 is a 2D (top) view of a simplified representation of assemblies such as depicted in FIGS. 1-3, and according to embodiments.

The second PCBs may for instance be arranged side by side on one side of the first PCB, as illustrated in FIG. 4. The second PCBs may also be arranged in one or more pairs, with each second PCBs of one pair on each side 211, 212 of the first PCB, as illustrated in FIGS. 2 and 3. As seen in these figures, two second PCBs are maintained essentially parallel and opposite to the first PCB and connected to the first PCB by way of elastomeric connectors 31, 32, 31*a* and 32*a*, and flexible connectors 40, 40*a*. In addition, connectors C1, C2, C1*a*, C2*a* and contact tracks 45 may be involved, just as before. This way, very compact arrangements of PCBs can be achieved.

An example of compact arrangement is one where the assembly comprises a set of four second PCBs 22 arranged on one side 212 of the first PCB 21, as seen in FIG. 4. Symmetrizing this configuration, one obtains a set of eight second PCBs 22, with four second PCBs arranged on one side 211 of the first PCB 21 and four second PCBs arranged on the other side 212 of the first PCB 21. Still, less symmetrical arrangements may be contemplated, with one or more second PCBs arranged on one side 212 of the first PCB 21, and possibly one or more other second PCBs arranged on the other side 211 of the first PCB 21. The optimal configuration may in each case depend on other components present in the assembly.

Such arrangements are compatible with second PCBs comprising, each, one or two flat flash memory components 61, 62 on one side (or opposite sides) thereof, e.g., a NAND flash memory components. More generally, one or more of, or each of the second PCBs 22, 22*a* evoked herein may comprise flat flash memory components 61, 62, 61*a*, 62*a*. Such components can for instance be soldered to both sides of a second PCB. Note that one or more, or each of the second PCBs may actually comprise more than two flat flash memory components, e.g., with two or more components provided on one same side thereof. Advantageously, the average thickness of an elastomeric connector 31, 32 may be chosen or designed such as to substantially amount to that of a flash memory component 61, 62. For example, any or each second PCB may be an mSATA PCB, which comprises two flash memory components 61, 62 on each side thereof, which preferably are NAND Flash memory components. As further illustrated in FIGS. 1-3, one 62 of the flash memory components may be provided with a recess accommodating fixation means 71. Additional, corresponding memory controllers may be provided too, if necessary.

As said earlier, the optimal configuration of the second PCBs may further depend on other components present in the assembly. In this respect, the present PCB assemblies may further comprise a power converter 80 and a module controller 90, as illustrated in FIG. 4. These additional modules 80, 90 are preferably arranged on one side of the first PCB 21 and are, each, arranged in electrical contact with the first PCB 21. The module controller is typically electrically connected to one or more second PCB 22 and is otherwise configured to enable the power converter 80.

Present PCB assemblies are preferably used in micro servers, to which the present invention extends. As known, a microserver is a small server appliance that essentially works like a server, designed for ease of installation and maintenance. It typically comes with an operating system, hardware and software preinstalled and configured by the manufacturer, although some configuration functions shall still be performed by the end-user. In variants, the methods and arrangements described herein can be used in the fabrication of integrated circuit chips packages, as part of either an intermediate product or an end product, where this end product may be any product that includes integrated circuit chips, ranging from low-end applications to advanced computer products.

The above embodiments have been succinctly described in reference to the accompanying drawings and may accommodate a number of variants. Several combinations of the above features may be contemplated. Examples are given in the next section.

The PCB assemblies discussed above are preferably implemented in a microserver that consists of three module types: compute modules (using a DIMM-240 connector); power converter modules (using an extreme PowerEdge connector); and switch modules (using an Impact 100 series connector, Molex). As noted earlier, the compute modules can also be used with storage devices, for instance based on Flash technology, e.g., mSATA disks. The mSATA disk standard measures 50.8×30 mm. The compute module height is 55 mm, its width is 138 mm (including the DIMM contacts) and its thickness is 1.27 mm. In the preferred microservers the pitch from one compute module to the next is 7.6 mm. Preferably, the storage module holds four or eight mSATA disks depending on the height profile of neighbor modules. As explained in the previous section, present embodiments allow to overcome issues arising from the size and encumbrance of usual connectors between the mSATA modules and the carrier PCB, and therefore allow to fit four mSATA drives on one side of the microserver compute module (of 138×55 mm, including DIMM contacts), or two sets of four mSATA drives on each side. Amongst other examples, SATA M.2. disks (under NGFF standard) can be contemplated too, instead of the mSATA disks. Still, mSATA disks are hereafter assumed, for the sake of illustration.

In all cases, a combination of elastomeric connectors (e.g., available under the trade name ZEBRA), flexible connectors and a stiff (e.g. metallic or ceramic) U-shaped holder are used for contacting the mSATA modules. The mSATA modules are otherwise fixed to the main PCB by way of bolts and nuts 71, as illustrated in FIGS. 1-3 (FIG. 3 differs in the form of the flexible connector, here making a U-turn). FIG. 4 shows the front side of an entire module, including two optional components 80, 90 for power conversion and module control. Useful details concerning such components can be found in the publication "Monitoring and Controlling System for Microservers," cited in introduction.

The flexible connectors are not visible in FIG. 4. Advantageously, they should consist of two segments per mSATA disk, because the mSATA connector is split between power and signals. By splitting the flexible connectors, one can use different technologies for the two cases, a one-layer version with thicker copper layer for the power supply and a dual layer for controlled impedance for the high-speed signals. More generally, any flexible connector 40 used in this invention could be split between power and signals, such as to exhibit distinct channels to convey power and signal.

The present assemblies can be obtained using any suitable fabrication method. Advantageously yet, a tool may be designed for assembly of the modules, which:

1. Holds the first PCB 21 firmly at a precisely fixed location (with e.g., a deviation less than 0.1 mm);
2. Avoids bending of the first PCB 21;
3. Allows aligning the second PCBs 22 individually on first PCB 21; and afterwards allows to:
4. Hold the second PCBs 22 in their positions;
5. Insert the inner elastomeric connector(s) 31;
6. Hold the inner elastomeric connector(s) 31 at its location;
7. Add the outer elastomeric connector 32;
8. Hold the outer elastomeric connector 32, while
9. Aligning the flexible connectors 40 with the second PCB; and finally
10. Adding the fastening structure 50

The above process assumes that the flex print 40 is already attached to the first PCB. A tool enabling this process can be made either for manual assembly or automated volume assembly, and can be scaled for cost vs. productivity.

Item 1 above can be achieved with a rubber covered wrench. Item 2 can be achieved by applying tension to both sides of the base PCB, or for the one-sided case by support from the back side over the entire area. Item 3 can done with two blades that are hold in a parallel fashion at a distance corresponding to the width of the disks (e.g., 30 mm for mSATA disks), similar to a tweezers. For more precision and faster operation a guidance trail per disk can be provided, which has a fixed location relative to the PCB fixture of item 1. Item 4 can be achieved with a punch that presses the disks (preferably at two points) against the base PCB. It can be further improved by applying a gel or paste between the disk and storage module PCB. Item 6 can be achieved with a narrow bar that is arranged from top. Item 8 can be carried out with a comb-like structure that presses the outer elastomeric connector between the locations of the flex connectors. The end of the flex prints can be fixed by a set of small tongs during addition of the holder. All alignment operations can be improved by means of magnifying glasses, cameras, and/or transparent templates.

While the present invention has been described with reference to a limited number of embodiments, variants and the accompanying drawings, it will be understood by those skilled in the art that various changes may be made and equivalents may be substituted without departing from the scope of the present invention. In particular, a feature recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other storage modules than those specifically discussed here can be contemplated.

The invention claimed is:

1. A method of forming a printed circuit board (PCB) assembly, the method comprising:
   disposing a first PCB and a second PCB substantially parallel and opposite to each other and each having a first side and a second side opposite to each other, such that the second side of the first PCB is opposite to the first side of the second PCB;
   wherein the second PCB has a first set of side connectors on the first side and a second set of side connectors on the second side, the first and second sets of connectors configured for both electrical power supply to and signal communication with the second PCB;
   electrically and mechanically connecting the second PCB to the second side of the first PCB via a first elastomeric connector arranged between the first side of the second PCB, where the first elastomeric connector connects to the first set of connectors, and the second side of the first PCB; and
   electrically connecting the second PCB to the first PCB via the second set of side connectors and a flexible electrical connector that is electrically connected to the second set of side connectors and the first PCB.

2. The method of claim 1, further comprising electrically connecting the second PCB to the first PCB via a second elastomeric connector, which connects to the second set of side connectors of the second PCB, and the electrical connector, which connects both the second elastomeric connector and the first PCB.

3. The method of claim 2, further comprising electrically connecting the second PCB to the first side of the first PCB via the second set of side connectors and the flexible electrical connector, the flexible electrical connector connected to the first side of the first PCB.

4. The method of claim 1, wherein the electrical connector has a portion extending over a lateral edge of the first PCB and a lateral edge of the second PCB, perpendicularly to average planes of the first and second PCBs.

5. The method of claim 4, wherein the electrical connector is a flat flex cable.

6. The method of claim 4, wherein the electrical connector is a rigid-flex connector, which is integral with the first PCB.

7. The method of claim 1, further comprising configuring a fastening structure to maintain the flexible electrical connector, the first elastomeric connector, the second elastomeric connector, and a lateral edge of each of the first PCB and the second PCB.

8. The method of claim 7, wherein the fastening structure has a U-section and is arranged so as to clamp the flexible electrical connector, the first elastomeric connector, the second elastomeric connector, and the lateral edge of each of the first PCB and the second PCB.

9. The method of claim 1, wherein the assembly comprises a set of at least two second PCBs, each configured with respect to the first PCBs similarly as the second PCB, wherein each of the second PCBs is maintained substantially parallel and opposite to the first PCB, and wherein the second PCBs are arranged side by side on one side of the first PCB or in one or more pairs, with each second PCBs of one pair on each side of the first PCB.

10. The method of claim 9, further comprising arranging one or more of the second PCBs on the second side of the first PCB, and arranging one or more other second PCBs of the set on the first side of the first PCB.

11. The method of claim 9, wherein the assembly comprises a set of four second PCBs, each arranged on the second side of the first PCB, wherein four second PCBs of the set are arranged on the first side of the first PCB and four second PCBs of the set are arranged on the second side of the first PCB.

12. The method of claim 1, wherein the first PCB comprises a storage module PCB and any second PCB comprises an mSATA PCB.

13. The method of claim 1, further comprising configuring a substantially flat flash memory component on one side of a second PCB, which flash memory component has an average thickness that substantially corresponds to the thickness of the first elastomeric connector, and wherein the assembly further comprises two flash memory components on each side of the second PCB, and wherein one or each flash memory component is a NAND flash memory.

14. The method of claim 1, further comprising arranging a power converter and a module controller in electrical contact with, on one side of, the first PCB, wherein the module controller is electrically connected to one or more second PCB and is otherwise configured to enable the power converter.

15. The method of claim 1, wherein the first elastomeric connector is electrically conducting along directions perpendicular to an average plane and are not electrically conducting in-plane, and comprise deformable layers of alternating conductive and insulating materials.

* * * * *